(12) United States Patent
Kim et al.

(10) Patent No.: US 9,716,048 B2
(45) Date of Patent: Jul. 25, 2017

(54) SEMICONDUCTOR DEVICE HAVING A PERIPHERAL-REGION DEFECT DETECTION STRUCTURE

(71) Applicant: Samsung Electronics Co., Ltd., Suwon-si, Gyeonggi-do (KR)

(72) Inventors: Sundae Kim, Hwaseong-si (KR); Yun-Rae Cho, Suwon-si (KR); Namgyu Baek, Suwon-si (KR); Seokhyun Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/985,379

(22) Filed: Dec. 30, 2015

(65) Prior Publication Data

US 2016/0233171 A1  Aug. 11, 2016

(30) Foreign Application Priority Data

Feb. 6, 2015  (KR) .................. 10-2015-0018745

(51) Int. Cl.
*H01L 21/66*  (2006.01)
(52) U.S. Cl.
CPC .................. *H01L 22/34* (2013.01)
(58) Field of Classification Search
CPC  H01L 22/30; H01L 23/544; H01L 2223/5446
See application file for complete search history.

(56) References Cited

U.S. PATENT DOCUMENTS

| | | | | |
|---|---|---|---|---|
| 8,343,830 B2* | 1/2013 | Kikuchi | ............ | H01L 21/76814 257/300 |
| 8,624,401 B2 | 1/2014 | Ishikawa | | |
| 8,637,376 B2* | 1/2014 | Sugioka | ............ | H01L 21/31053 257/68 |
| 8,803,308 B2 | 8/2014 | Ishikawa | | |
| 2005/0087817 A1* | 4/2005 | Zhang | ................ | H01L 27/0688 257/390 |
| 2011/0080180 A1* | 4/2011 | Lavoie | .................... | H01L 22/12 324/659 |
| 2011/0221460 A1* | 9/2011 | Trebo | ................. | G01R 31/2884 324/750.3 |
| 2012/0292759 A1 | 11/2012 | Ishikawa | | |
| 2013/0009663 A1 | 1/2013 | Gauch et al. | | |
| 2013/0020679 A1* | 1/2013 | Nagai | ..................... | H01L 22/14 257/532 |
| 2013/0249578 A1 | 9/2013 | Yokou et al. | | |

(Continued)

FOREIGN PATENT DOCUMENTS

JP  2007142131 A  6/2007
JP  2012227210 A  11/2012
JP  2012243910 A  12/2012
(Continued)

*Primary Examiner* — Ida M Soward
(74) *Attorney, Agent, or Firm* — Renaissance IP Law Group LLP

(57) ABSTRACT

Provided is a semiconductor device including an interconnection structure provided on a cell region of a substrate to include a first line and a second line sequentially stacked on the substrate, and a defect detection structure provided on a peripheral region of the substrate to include first and second defect detection lines provided at the same levels as those of the first and second lines, respectively.

15 Claims, 25 Drawing Sheets

(56) References Cited

U.S. PATENT DOCUMENTS

2014/0151702 A1   6/2014  Ishikawa
2014/0152976 A1   6/2014  VanHoomissen et al.

FOREIGN PATENT DOCUMENTS

| | | |
|---|---|---|
| JP | 2013197576 A | 9/2013 |
| JP | 2013219084 | 10/2013 |
| KR | 100571675 B1 | 4/2006 |
| KR | 1020090058306 A | 6/2009 |

* cited by examiner

SEMICONDUCTOR DEVICE HAVING A PERIPHERAL-REGION DEFECT DETECTION STRUCTURE

CROSS-REFERENCE TO RELATED APPLICATIONS

This U.S. non-provisional patent application claims priority under 35 U.S.C. §119 to Korean Patent Application No. 10-2015-0018745, filed on Feb. 6, 2015, in the Korean Intellectual Property Office, the entire contents of which are hereby incorporated by reference.

BACKGROUND

Example embodiments of the inventive concept relate to a semiconductor device, and in particular, to a memory semiconductor device.

Due to their small-size, multifunctionality, and/or low-cost characteristics, semiconductor devices are considered as important elements in the electronic industry. The semiconductor devices can be generally classified into a memory device for storing data, a logic device for processing data, and a hybrid device capable of performing various functions.

There is an increasing demand for a semiconductor device with a higher integration density and higher performance. Various researches are conducted to satisfy the above demands.

SUMMARY

Example embodiments of the inventive concept provide a high-density and high-performance semiconductor device.

According to example embodiments of the inventive concept, a semiconductor device may include a substrate including a cell region and a peripheral region, an interconnection structure on the cell region to include a first line and a second line sequentially stacked on the substrate, and a defect detection structure on the peripheral region to include a first defect detection line and a second defect detection line provided at the same levels as those of the first and second lines, respectively.

In example embodiments, the interconnection structure may further include a first contact plug on the cell region to electrically connect the first and second lines to each other.

In example embodiments, the defect detection structure may further include a second contact plug provided at the same level as that of the first contact plug, on the peripheral region, to electrically connect the first and second defect detection lines to each other.

In example embodiments, the interconnection structure may further include a third line provided on the cell region and between the first and second lines.

In example embodiments, the interconnection structure may further include a first contact plug electrically connecting the first and third lines to each other and a second contact plug electrically connecting the second and third lines to each other, and the defect detection structure may further include a third contact plug electrically connecting the first and second defect detection lines to each other.

In example embodiments, the defect detection structure may further include a third defect detection line provided on the peripheral region and positioned at substantially the same level as that of the third line.

In example embodiments, the interconnection structure may further include a first contact plug electrically connecting the first and third lines to each other and a second contact plug electrically connecting the second and third lines to each other, and the defect detection structure may further include a third contact plug electrically connecting the first and third defect detection lines to each other and a fourth contact plug electrically connecting the second and third defect detection lines to each other.

In example embodiments, when viewed in plan view, the second defect detection line may be shaped like an open rectangular ring having end portions separated from each other, and the defect detection structure may further include detection pads electrically connected to the end portions of the second defect detection line.

In example embodiments, the first defect detection line may have a shape corresponding to that of the second defect detection line.

In example embodiments, the first defect detection line may include first patterns horizontally separated from each other.

In example embodiments, the defect detection structure may further include a third defect detection line between the first and second defect detection lines, and the third defect detection line may include second patterns which are horizontally separated from each other and may be disposed to cross the first patterns.

In example embodiments, the defect detection structure may further include two first contact plugs, which are connected in common to a corresponding one of the first patterns but are respectively connected to different ones of the second patterns.

In example embodiments, the defect detection structure may further include a plurality of second contact plugs, each electrically connecting a corresponding one of the second patterns to the second defect detection line.

In example embodiments, when viewed in plan view, the second defect detection line may include patterns horizontally separated from each other to enclose the interconnection structure, and the defect detection structure may further include detection pads electrically connected to end portions of each of the patterns.

In example embodiments, the first and second lines, the first and second defect detection lines, and the first and second contact plugs may include at least one of polysilicon, tungsten, and copper.

According to example embodiments of the inventive concept, a semiconductor device may include a substrate including a cell region and a peripheral region, an interconnection structure including a first line, a first contact plug, a second line, a second contact plug, and a third line sequentially stacked on the cell region of the substrate, and a defect detection structure including a first defect detection line, a third contact plug, a second defect detection line, a fourth contact plug, and a third defect detection line sequentially stacked on the peripheral region of the substrate. The first defect detection line may include a plurality of first patterns, the second defect detection line may include a plurality of second patterns crossing the first patterns, and the third contact plug connects the first and second patterns electrically to each other.

In example embodiments, a pair of third contact plugs may be provided on each of the first pattern and may be electrically and respectively connected to different ones of the second patterns.

In example embodiments, the first line may be positioned at substantially the same level as that of the first defect detection line.

In example embodiments, the second line may be positioned at substantially the same level as that of the second defect detection line.

In example embodiments, when viewed in plan view, the second defect detection line may be shaped like an open rectangular ring having end portions separated from each other, and the defect detection structure may further include detection pads electrically connected to the end portions of the second defect detection line.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
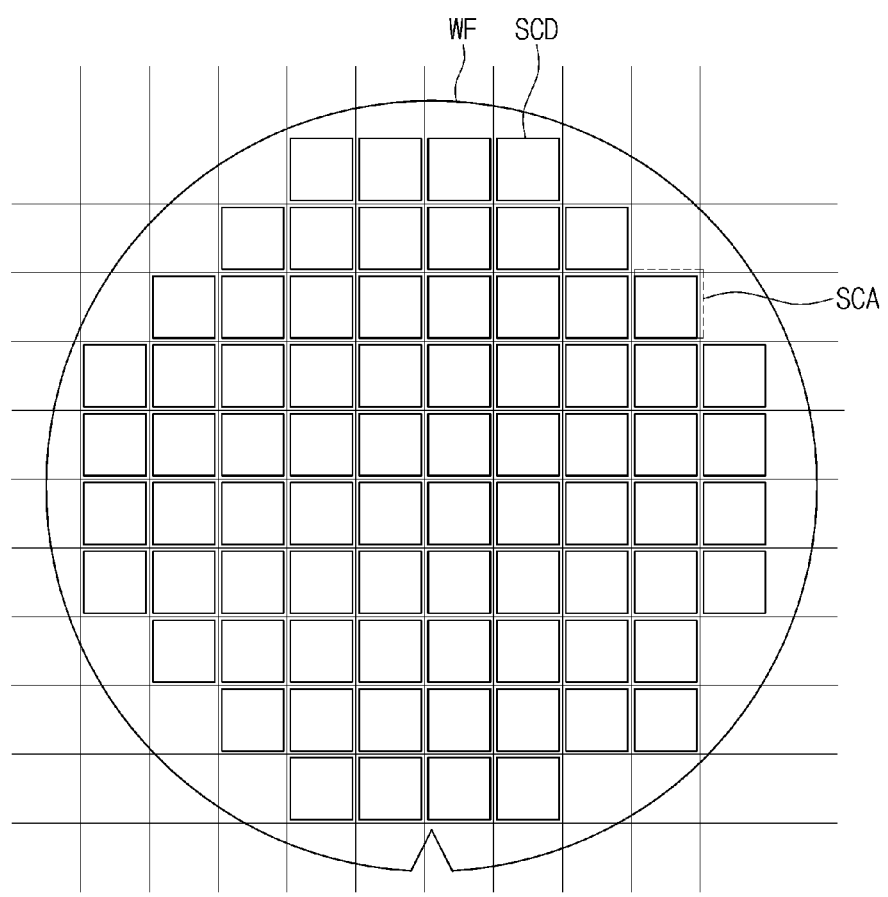
FIG. 1 is a plan view illustrating a wafer provided with a plurality of semiconductor devices.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
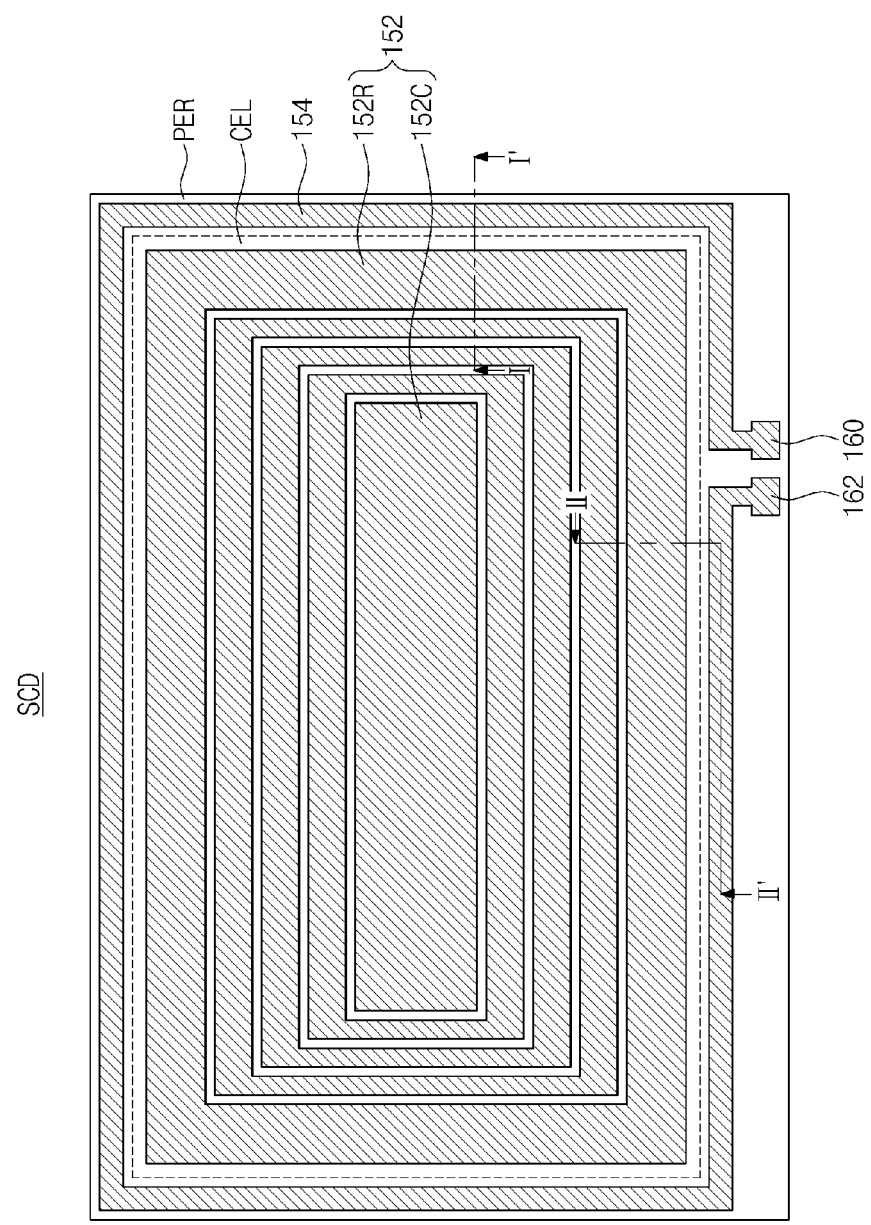
FIG. 2 is a plan view illustrating a semiconductor device according to example embodiments of the inventive concept.
Figure 3A:
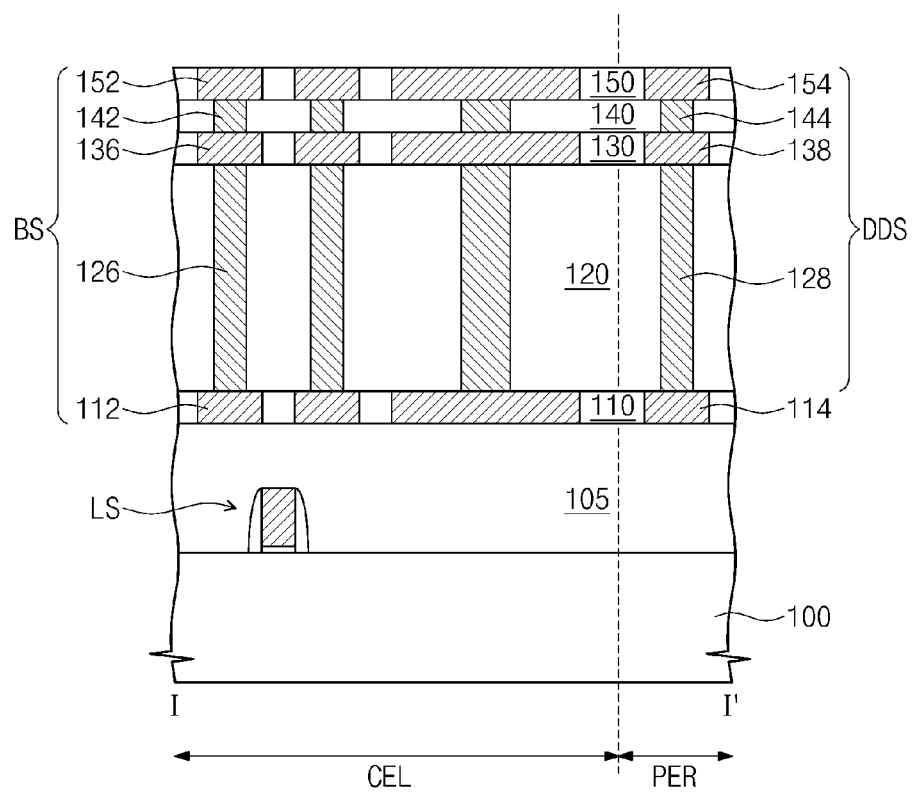
FIGS. 3A and 3B are sectional views of the semiconductor device of FIG. 2, taken along line I-I' of FIG. 2.
Figure 3B:
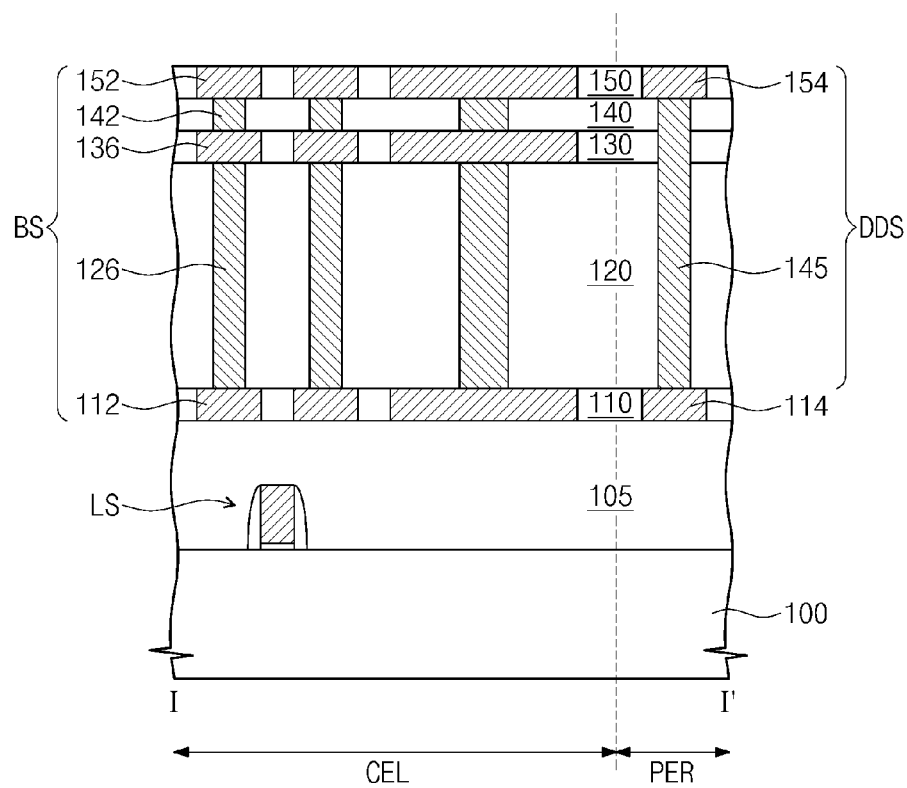

FIG. 1 is a plan view illustrating a wafer provided with a plurality of semiconductor devices, and FIG. 2 is a plan view illustrating a semiconductor device according to example embodiments of the inventive concept. FIGS. 3A and 3B are sectional views of the semiconductor device of FIG. 2, taken along line I-I' of FIG. 2, and FIGS. 4A through 4C are sectional views of the semiconductor device of FIG. 2, taken along line II-II' of FIG. 2. FIGS. 5A and 5B are plan views illustrating defect detection structures according to example embodiments of the inventive concept.

Referring to FIG. 1, a plurality of semiconductor devices SCD may be disposed on a wafer WF. The semiconductor devices SCD may be arranged in column and row directions and may be separated from each other by a scribe region SCA.

Each of the semiconductor devices SCD may be separated from the others by a sawing process. Here, the sawing process may be performed along the scribe region SCA of the wafer WF.

Referring to FIGS. 2, 3A, 3B, 4A, 4B, and 4C, each of the separated semiconductor devices SCD may include a substrate 100 with a cell region CEL and a peripheral region PER, an interconnection structure BS disposed on the cell region CEL of the substrate 100, and a defect detection structure DDS disposed on the peripheral region PER of the substrate 100. The defect detection structure DDS may be configured to detect a chipping defect, which may occur in the sawing process of FIG. 1. The method of detecting the chipping defect will be described below.

The substrate 100 may be a semiconductor substrate including silicon, germanium, or silicon/germanium, a silicon-on-insulator (SOI) wafer, or a germanium-on-insulator (GOI) wafer.

The interconnection structure BS may include a plurality of lines 112, 136, and 152 disposed at vertically different levels. As an example, the interconnection structure BS may include first lines 112 provided in a first insulating layer 110, second lines 136 provided in a second insulating layer 130, and third lines 152 provided in a third insulating layer 150, which are sequentially and vertically stacked on the substrate 100. As shown in FIG. 2, when viewed in plan view, the third lines 152 may include a line-shaped third line 152C and a plurality of third lines 152R, each of which is provided to enclose the third line 152C and is shaped like a rectangular ring. In example embodiments, the second lines 136 and the first lines 112 may be configured to have the same or different structural features as those of the third lines 152. The first to third insulating layers 110, 130, and 150 may be formed to cover not only the cell region CEL but also the peripheral region PER.

Also, the interconnection structure BS may further include a first contact plug 126 connecting the first and second lines 112 and 136 to each other and a second contact plug 142 connecting the second and third lines 136 and 152 to each other. The first contact plug 126 may be provided to penetrate a first interlayered insulating layer 120 between the first and second insulating layers 110 and 130, and the second contact plug 142 may be provided to penetrate a second interlayered insulating layer 140 between the second and third insulating layers 130 and 150. The first and second interlayered insulating layers 120 and 140 may be formed to cover not only the cell region CEL but also the peripheral region PER.

As described herein, the layer number of the interconnection structure BS may be three, but example embodiments of the inventive concepts may not be limited thereto. Further, although not shown in detail, in the case where the semiconductor device SCD is a dynamic random access memory (DRAM), a lower structure LS including a transistor, a bit line, and a capacitor may be provided on the cell region CEL of the substrate 100. On the cell region CEL, an additional contact plug (not shown) may be provided to connect the lower structure LS electrically to the interconnection structure BS. In example embodiments, the semiconductor device SCD may be a DRAM device as exemplarily described herein, but in other embodiments, the semiconductor device SCD may be one of various memory devices, such as a static random access memory (SRAM), a phase changeable access memory (PRAM), a magnetic random access memory (MRAM), and FLASH memory.

The defect detection structure DDS may include defect detection lines 114, 138, and 154, disposed at vertically different levels. Since the defect detection lines of the defect detection structure DDS are disposed at vertically different levels, the usage of the defect detection structure DDS makes it possible to detect a chipping defect, which may occur at not only the top level but also the underlying levels of the interconnection structure BS, for example, during a sawing process.

Hereinafter, vertical and planar structures of the defect detection structure DDS will be described in more detail.

First, a vertical structure of the defect detection structure DDS will be described with reference to FIGS. 3A and 3B.

In an example shown in FIG. 3A, the defect detection structure DDS may include the first defect detection line 114 provided in the first insulating layer 110, the second defect detection line 138 formed in the second insulating layer 130, and the third defect detection line 154 formed in the third insulating layer 150, which are sequentially and vertically stacked on the substrate 100. As shown in FIG. 2, when viewed in plan view, the third defect detection line 154 may have a structure enclosing the third lines 152, and defect detection pads 160 and 162 may be provided at both ends of the third defect detection line 154. For example, the defect detection pads 160 and 162 may be used to perform a conduction test of the third defect detection line 154. In the case where the third defect detection line 154 is conductive, it can be determined that there is no chipping defect, and otherwise, it can be determined that there is a chipping defect.

Referring to FIG. 3A, the defect detection structure DDS may further include a first contact plug 128 electrically connecting the first and second defect detection lines 114 and 138 to each other and a second contact plug 144 electrically connecting the second and third defect detection lines 138 and 154 to each other. The first contact plug 128 of the defect detection structure DDS may be provided to penetrate the first interlayered insulating layer 120, and the second contact plug 144 of the defect detection structure DDS may be provided to penetrate the second interlayered insulating layer 140. In example embodiments, the first line 112 of the cell region CEL and the first defect detection line 114 of the peripheral region PER may be formed by the same process and thus be positioned at the same level. The first contact plug 126 of the interconnection structure BS of the cell region CEL and the first contact plug 128 of the defect detection structure DDS may be formed by the same process and thus be positioned at the same level. The second line 136 of the cell region CEL and the second defect detection line 138 of the peripheral region PER may be formed by the same process and thus be positioned at the same level. The second contact plug 142 of the interconnection structure BS of the cell region CEL and the second contact plug 144 of the defect detection structure DDS may be formed by the same process and thus be positioned at the same level. The third line 152 of the cell region CEL and the third defect detection line 154 of the peripheral region PER may be formed by the same process and thus be positioned at the same level.

According to another example shown in FIG. 3B, the defect detection structure DDS may have top and bottom defect detection lines associated with the uppermost and lowermost lines of the interconnection structure BS, respectively. For example, in the case where the interconnection structure BS consists of the first to third lines 112, 136, and 152, the defect detection structure DDS may include a first defect detection line 114 associated with the lowermost line (i.e., the first line 112) and a third defect detection line 154 associated with the uppermost line (i.e., the third line 152). In this case, the defect detection structure DDS may further include an extended contact plug 145 electrically connecting the first and third defect detection lines 114 and 154 to each other. The extended contact plug 145 may be provided to penetrate the first interlayered insulating layer 120, the second insulating layer 130, and the second interlayered insulating layer 140.

Hereinafter, the planar structure of the defect detection structure DDS will be described with reference to FIGS. 4A through 4C. For the sake of brevity, an example in which the defect detection structure DDS has the vertical structure of FIG. 3A will be exemplarily described below.

Figure 4A:
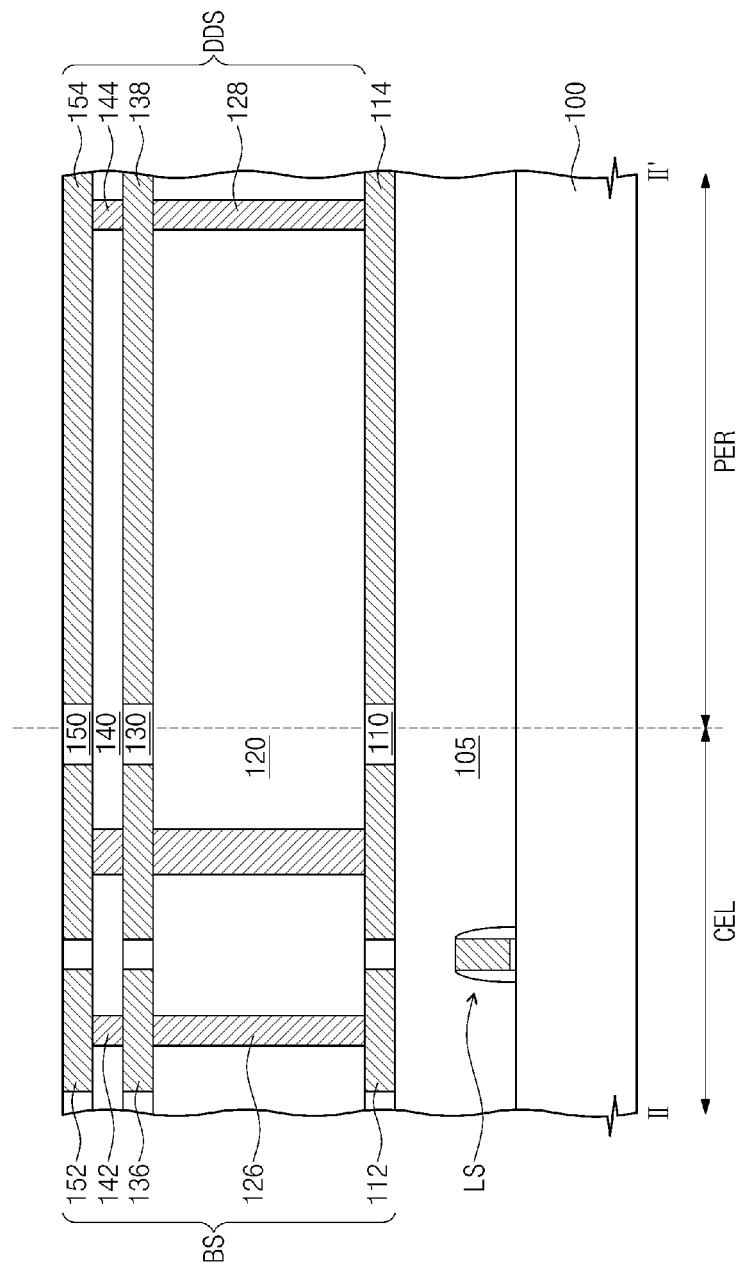
FIGS. 4A through 4C are sectional views of the semiconductor device of FIG. 2, taken along line II-II' of FIG. 2.
Figure 5A:
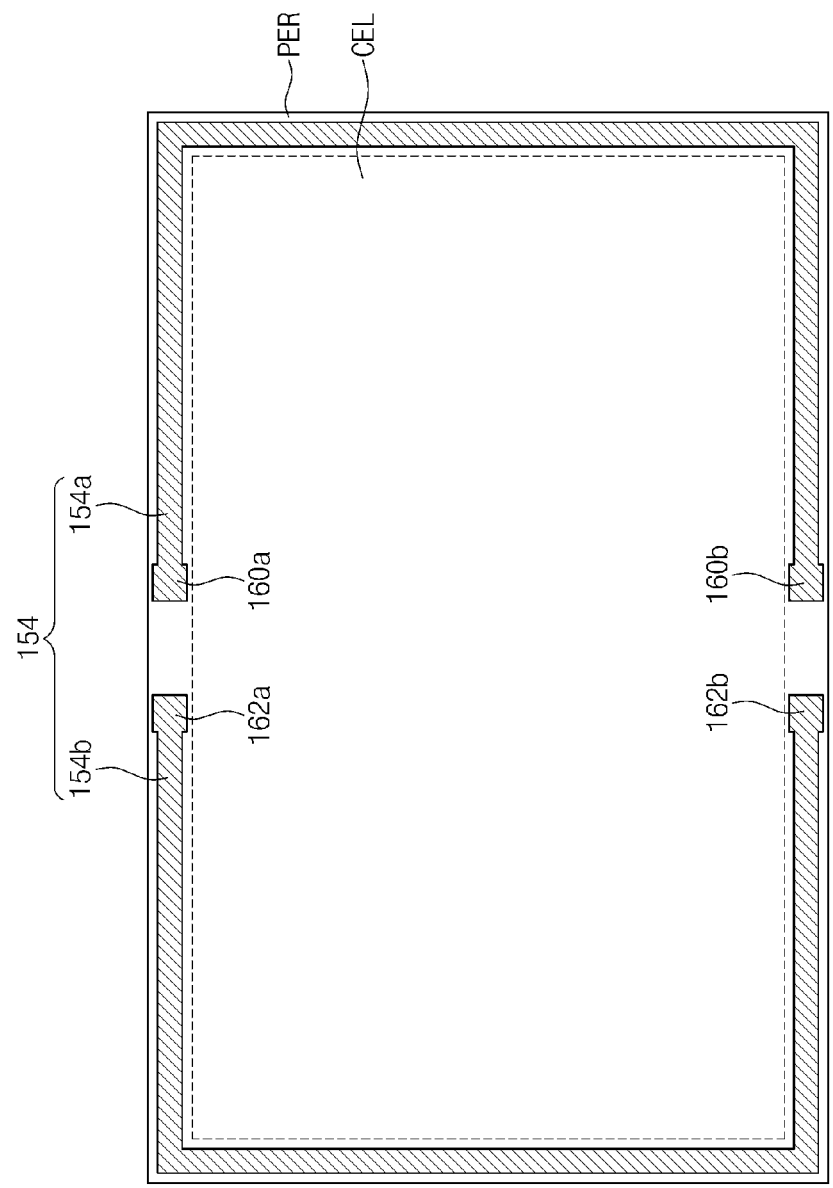
FIGS. 5A and 5B are plan views illustrating defect detection structures according to example embodiments of the inventive concept.
Figure 5B:
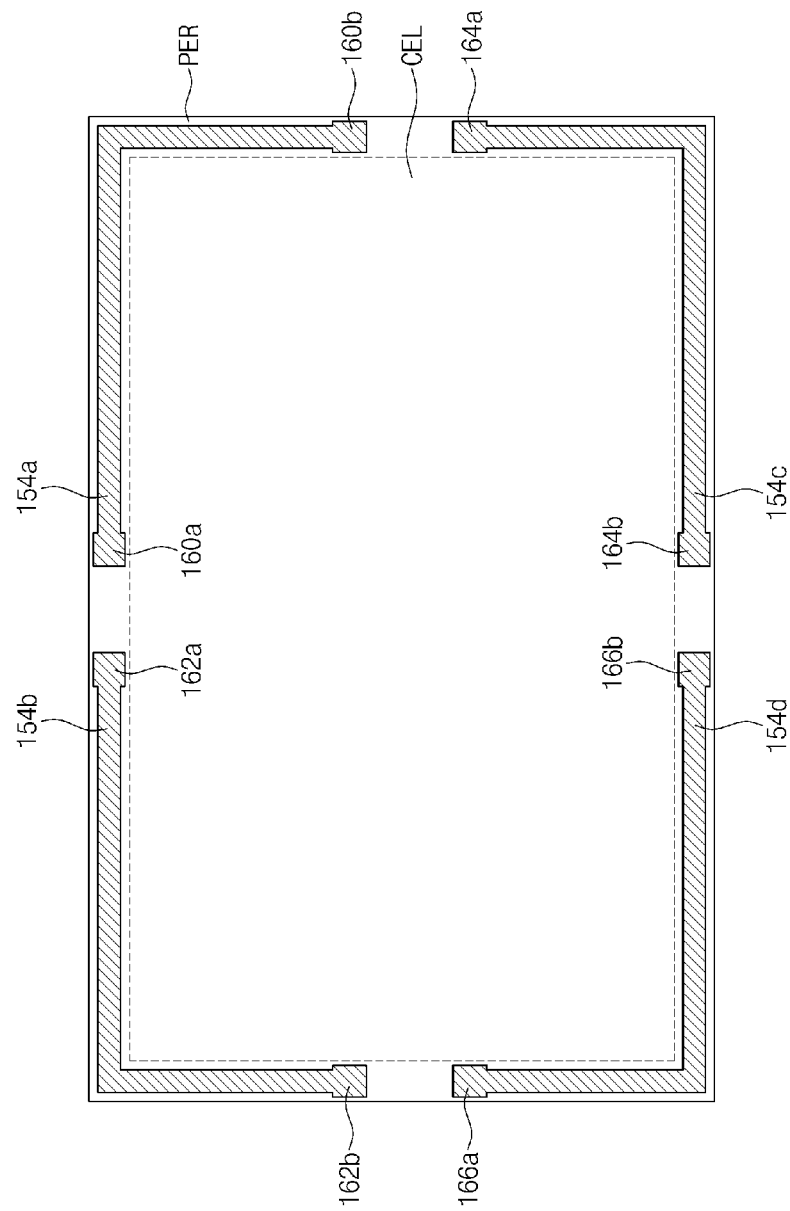

According to an example shown in FIG. 4A, each of the first to third defect detection lines 114, 138, and 154 may have a linear structure. Referring to FIGS. 2 and 4A, each of the first to third defect detection lines 114, 138, and 154 may be shaped like an open rectangular ring enclosing the interconnection structure BS. Each of the first to third defect detection lines 114, 138, and 154 may have four sides. As an example, the defect detection structure DDS may have a single first contact plug 128 and a single second contact plug 144. As another example, the defect detection structure DDS may have a plurality of first contact plug 128 and a plurality of second contact plugs 144. For example, four first and second contact plugs 128 and 144 may be disposed at the four sides, respectively, of a corresponding one of the first to third defect detection lines 114, 138, and 154.

Figure 4B:
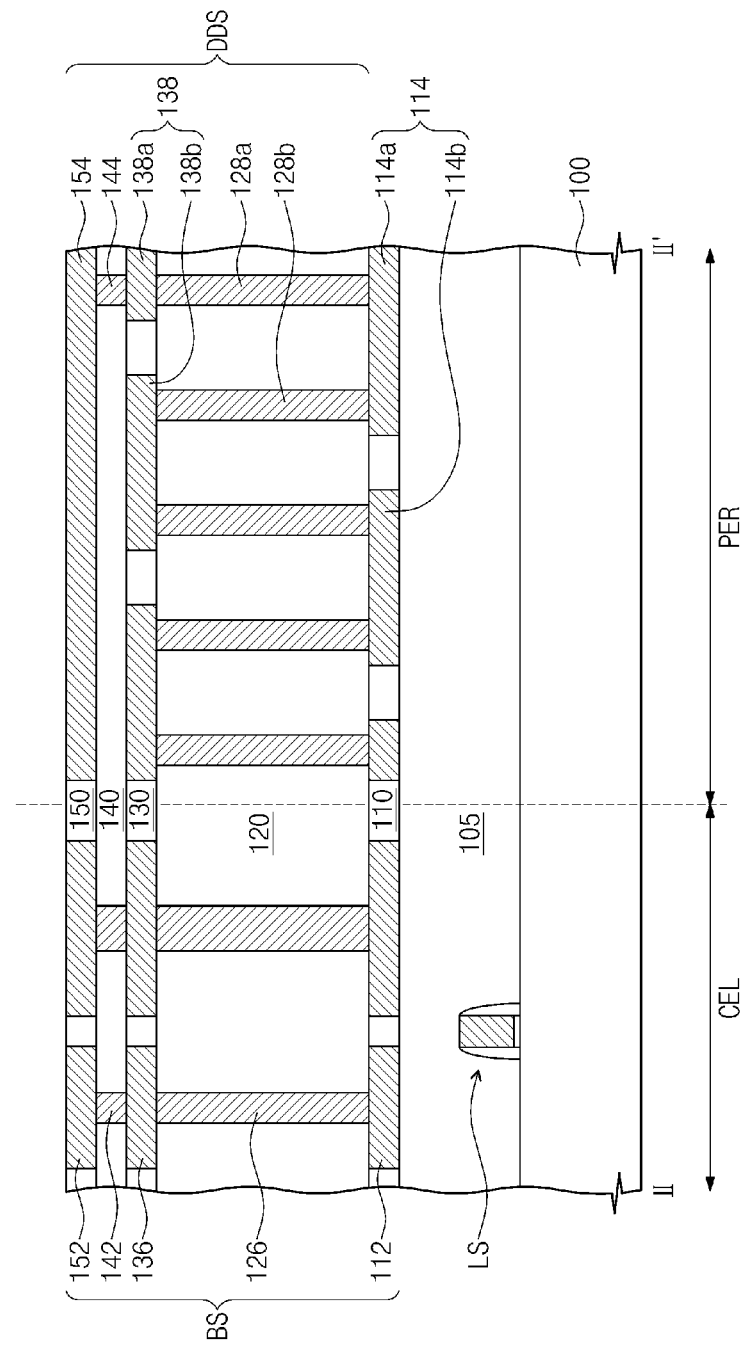

According to another example shown in FIG. 4B, the first defect detection line 114 may include first patterns 114a and 114b horizontally separated from each other. The second defect detection line 138 may include second patterns 138a and 138b horizontally separated from each other. The first patterns 114a and 114b and the second patterns 138a and 138b may be disposed to cross each other. The third defect detection line 154 may be shaped like an open rectangular ring having four linear portions and enclosing the interconnection structure BS. Further, the defect detection structure DDS may include a plurality of first contact plugs 128a and 128b. In example embodiments, two first contact plugs 128a and 128b provided on each first pattern 114a may be electrically connected to two different ones of the second patterns (e.g., 138a and 138b), respectively. The defect detection structure DDS may include one or more second contact plugs 144. In the case where a plurality of second contact plugs 144 are provided, they may be disposed on the four sides, respectively, of the third defect detection line 154. Since the first and second patterns 114a, 114b, 138a, and 138b are connected by the plurality of first contact plugs 128a and 128b, the peripheral region PER of the substrate 100 can have a robust structure.

Figure 4C:
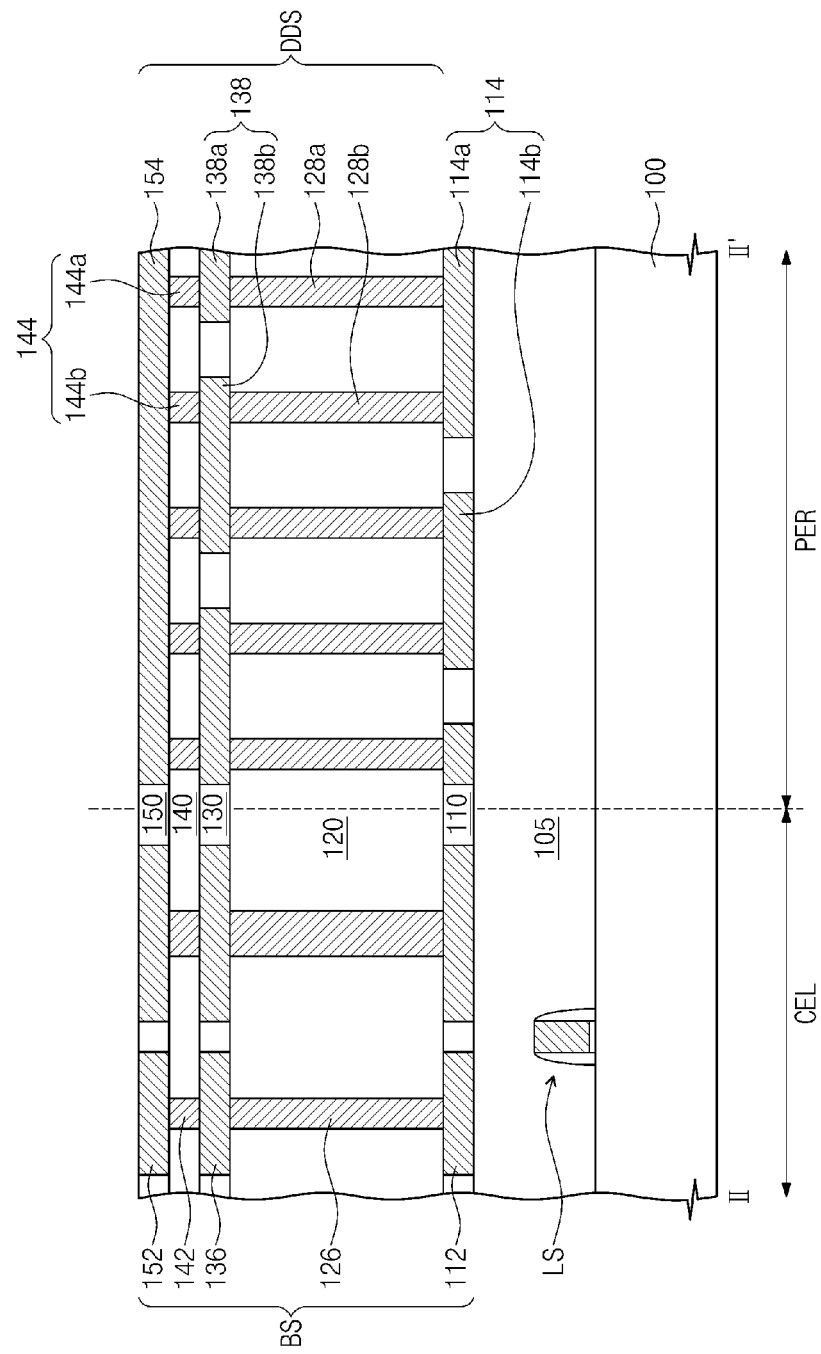

Referring to FIG. 4C, the first to third defect detection lines 114, 138, and 154 may be configured to have a structure similar to that of FIG. 4B, except that the defect detection structure DDS has second contact plugs 144a and 144b provided at positions corresponding to the first contact plugs 128a and 128b.

FIGS. 5A and 5B are plan views illustrating the third defect detection line 154 of the defect detection structure DDS. Referring to FIGS. 5A and 5B, the third defect detection line 154 may include third patterns 154a, 154b, 154c, and/or 154d enclosing at least two sides of the cell region CEL. Each of defect detection pads 160a, 160b, 162a, 162b, 164a, 164b, 166a, and/or 166b may be electrically connected to at least one of end portions of the third patterns 154a, 154b, 154c, and/or 154d. In an example of FIG. 5A, the third defect detection line 154 may include a pair of third patterns 154a and 154b disposed to face each other. In another example of FIG. 5B, the third defect detection line 154 may include two pairs of third patterns 154a, 154b, 154c, and 154d, each pair of which are disposed to face each other. In the present embodiment, the number of the third patterns 154a, 154b, 154c, and/or 154d is illustrated to be two or four, but example embodiments of the inventive concept are not limited thereto.

Hereinafter, a method of fabricating the semiconductor device SCD (e.g., of FIGS. 2 and 3A) will be described with reference to the drawings.

FIGS. 6A through 6H are sectional views illustrating a method of fabricating a semiconductor device SCD, according to example embodiments of the inventive concept.

Figure 6A:
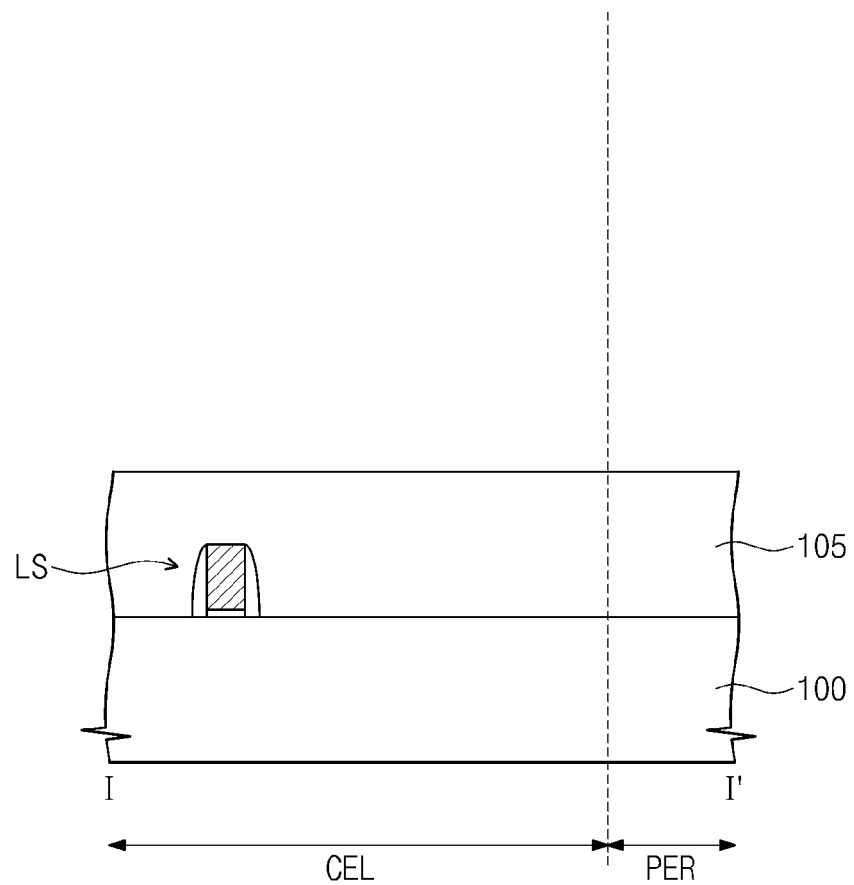
FIGS. 6A through 6H are sectional views illustrating a method of fabricating a semiconductor device, according to example embodiments of the inventive concept.

Referring to FIG. 6A, the lower structure LS may be formed on the substrate 100.

The substrate 100 may include the cell region CEL and the peripheral region PER. The lower structure LS may be formed on the cell region CEL of the substrate 100. If the semiconductor device SCD is a DRAM device, the lower structure LS may include a transistor, a bit line, a capacitor, and so forth. A first insulating layer 105 may be formed on the lower structure LS.

Figure 6B:
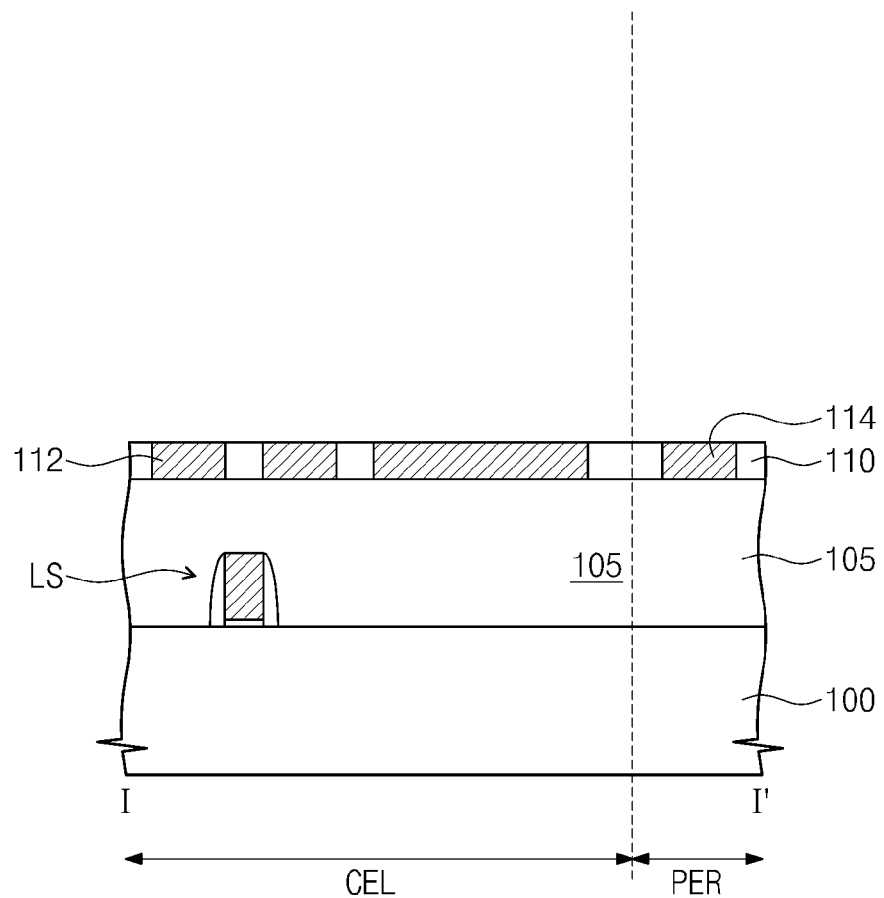

Referring to FIG. 6B, the first lines 112 and the first defect detection line 114 may be formed on the first insulating layer 105. The first lines 112 may be formed on the cell region CEL, and the first defect detection line 114 may be formed on the peripheral region PER.

Hereinafter, a process of forming the first lines 112 and the first defect detection line 114 will be described briefly.

As an example, a first conductive layer (not shown) may be formed on the first insulating layer 105. The first conductive layer may include polysilicon. The first conductive layer may be etched to form the first lines 112 on the cell region CEL and form the first defect detection line 114 on the peripheral region PER. The second insulating layer 110 may be formed to cover the first lines 112 and the first defect detection line 114. The second insulating layer 110 may be planarized to expose top surfaces of the first lines 112 and the first defect detection line 114.

As another example, the second insulating layer 110 may be formed on the first insulating layer 105 to have first openings (not shown) and a second opening (not shown). The first openings may be formed on the cell region CEL, and the second opening may be formed on the peripheral region PER. The first lines 112 and the first defect detection line 114 may be formed by filling the first and second openings with a conductive layer. The conductive layer may be formed of or include at least one of polysilicon or metals (e.g., tungsten or copper).

Figure 6C:
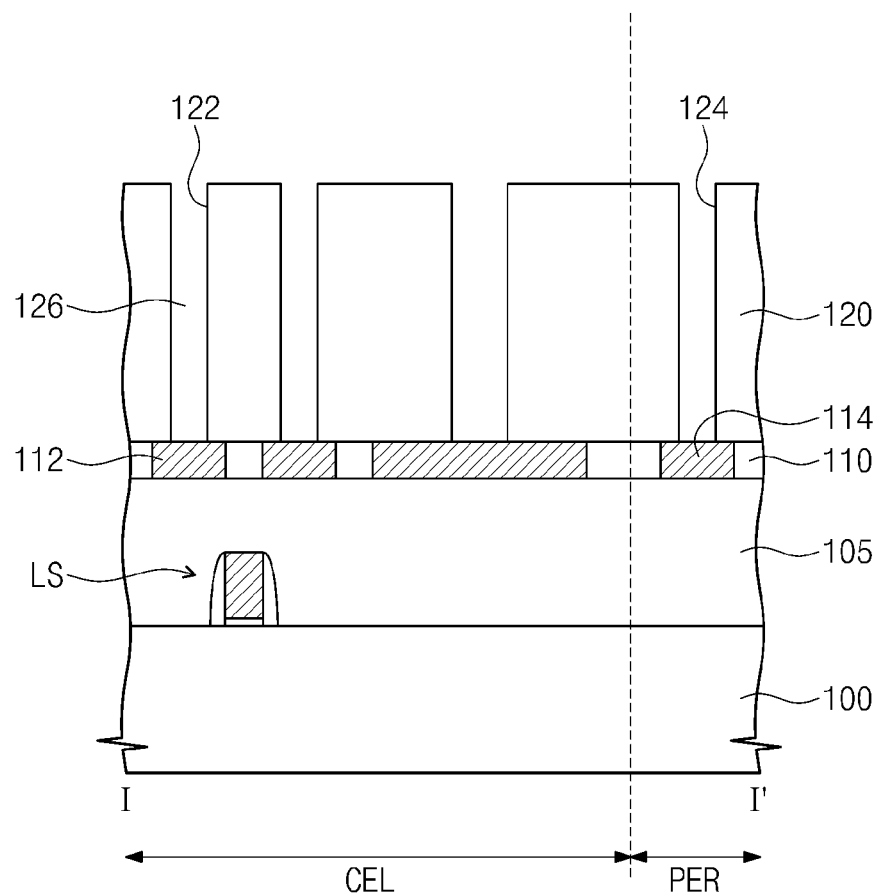

Referring to FIG. 6C, the third insulating layer 120 may be formed on the second insulating layer 110 to include first contact holes 122 respectively exposing the first lines 112 and a second contact hole 124 exposing the first defect detection line 114.

Figure 6D:
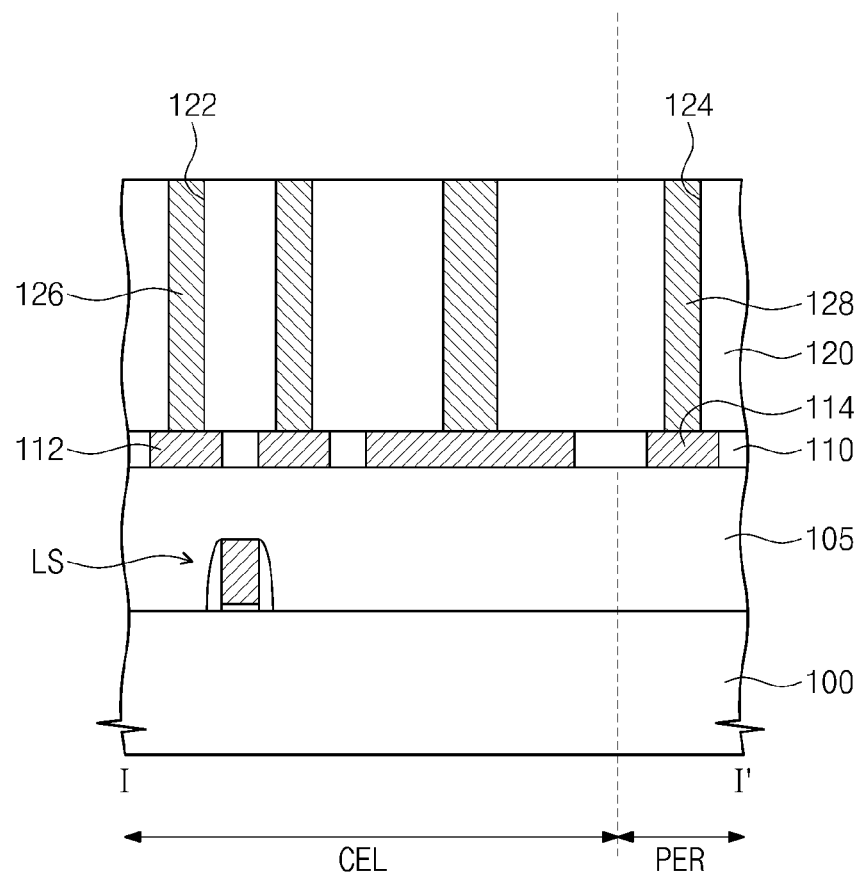

Referring to FIG. 6D, the first contact plugs 126 and the second contact plug 128 may be formed by filling the first and second contact holes 122 and 124 with a conductive layer. The conductive layer may be formed of or include at least one of polysilicon or metals (e.g., tungsten or copper). The first contact plugs 126 may be formed on the cell region CEL, and the second contact plug 128 may be formed on the peripheral region PER.

Figure 6E:
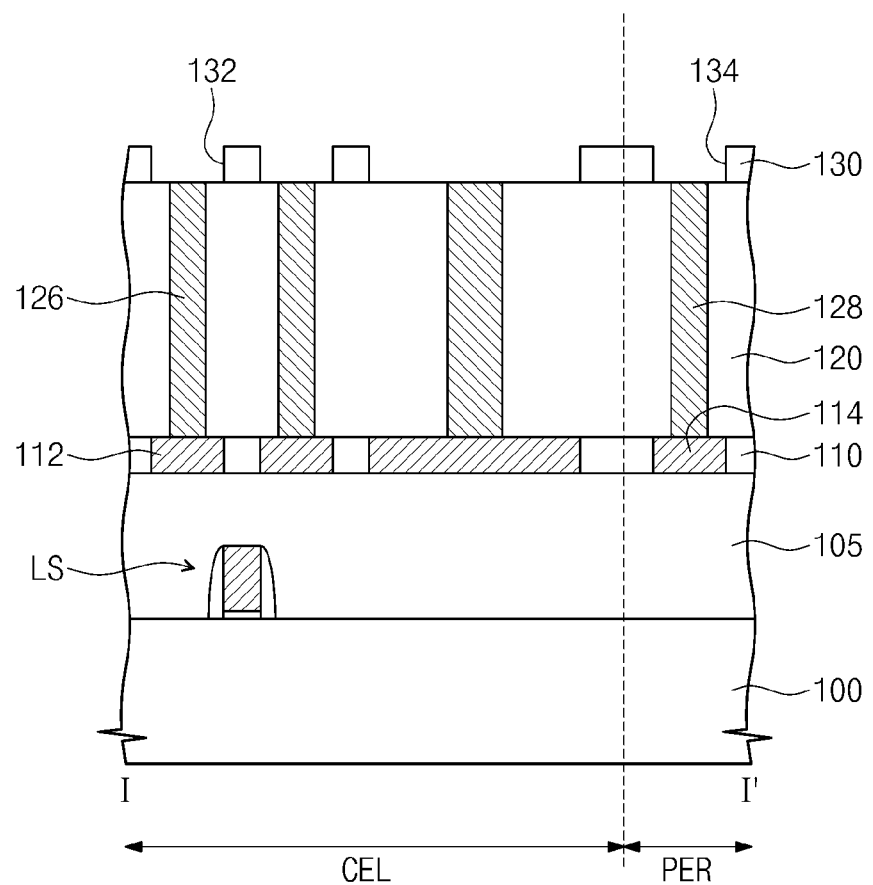

Referring to FIG. 6E, a fourth insulating layer 130 may be formed on the third insulating layer 120 to include third openings 132 exposing the first contact plugs 126 and a fourth opening 134 exposing the second contact plug 128.

Figure 6F:
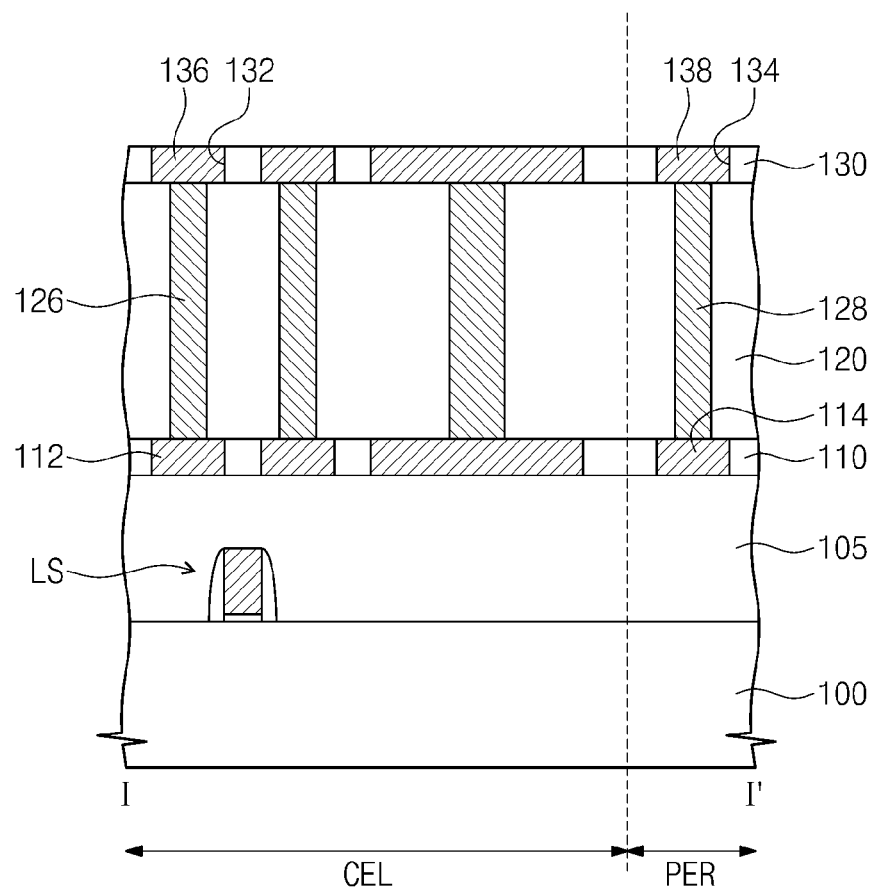

Referring to FIG. 6F, the third and fourth openings 132 and 134 may be filled with a conductive layer, and thus, the second lines 136 and the second defect detection line 138 may be formed on the cell and peripheral regions CEL and PER, respectively. The conductive layer may be formed of or include at least one of polysilicon or metals (e.g., tungsten or copper).

Figure 6G:
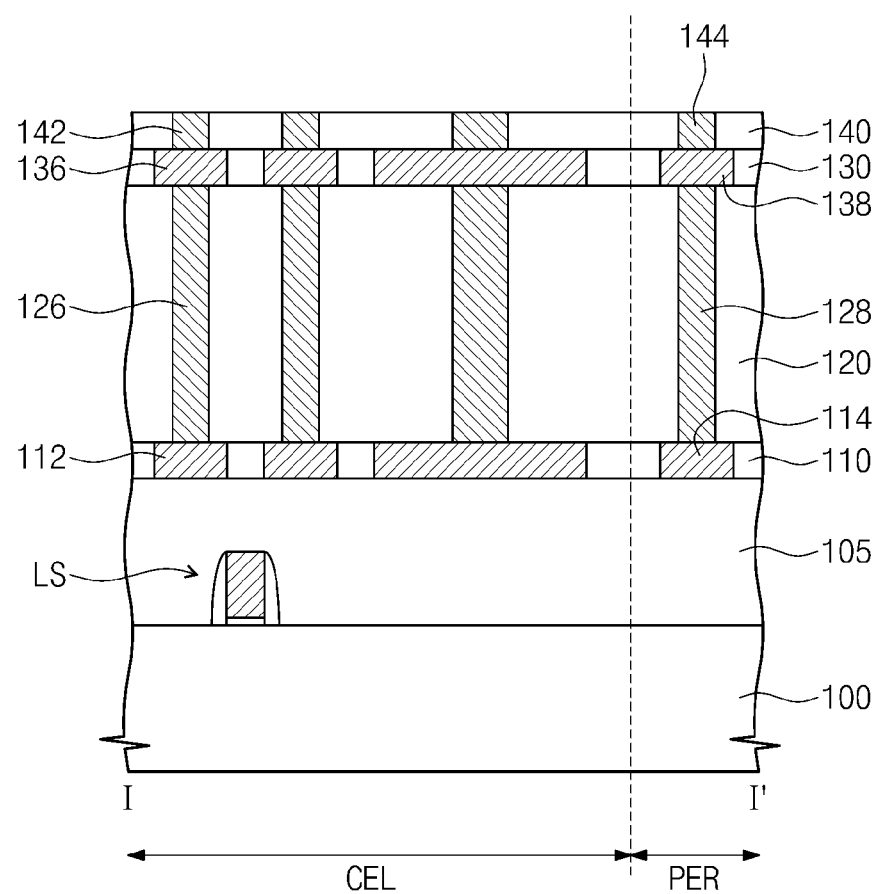

Referring to FIG. 6G, the fifth insulating layer 140, the third contact plugs 142, and the fourth contact plug 144 may be formed on the fourth insulating layer 130. The third contact plugs 142 may be formed on the cell region CEL, and the fourth contact plug 144 may be formed on the peripheral region PER. A process of forming the third and fourth contact plugs 142 and 144 may be performed in the same manner as that described with reference to FIGS. 6C and 6D, and thus, the description thereof is omitted.

Figure 6H:
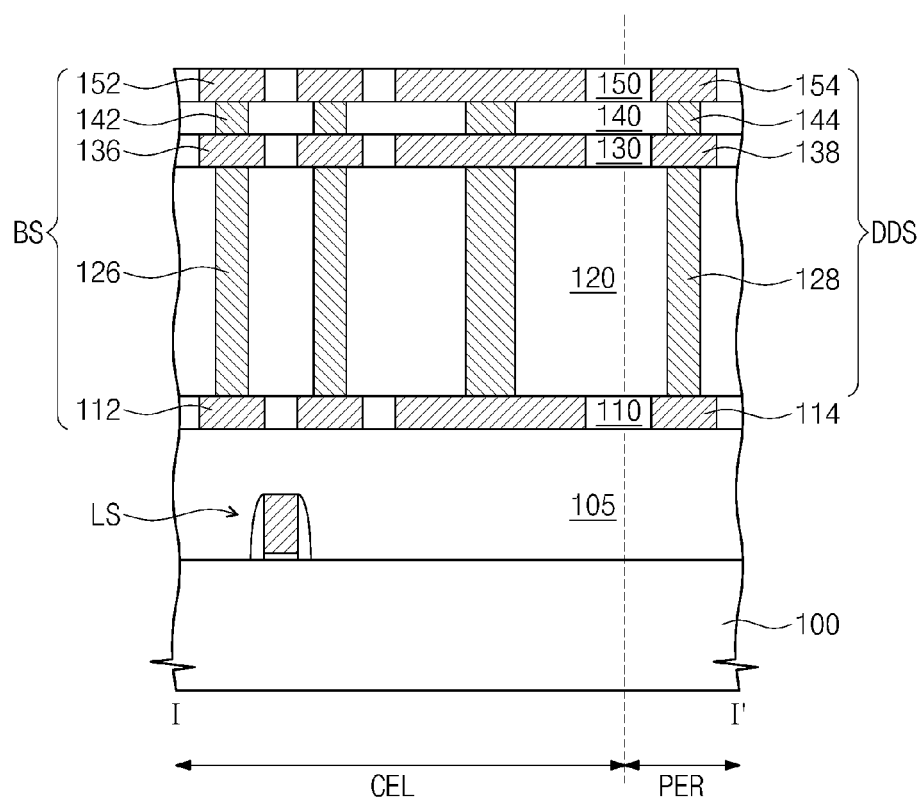

Referring to FIG. 6H, the sixth insulating layer 150, the third lines 152, and the third defect detection line 154 may be formed on the fifth insulating layer 140. The third lines 152 may be formed on the cell region CEL, and the third defect detection line 154 may be formed on the peripheral region PER. A process of forming the third lines 152 and the third defect detection line 154 may be performed in the same manner as that described with reference to FIGS. 6E and 6F, and thus, the description thereof is omitted.

FIGS. 7A through 7F are sectional views illustrating a method of fabricating a semiconductor device, according to other example embodiments of the inventive concept.

Figure 7A:
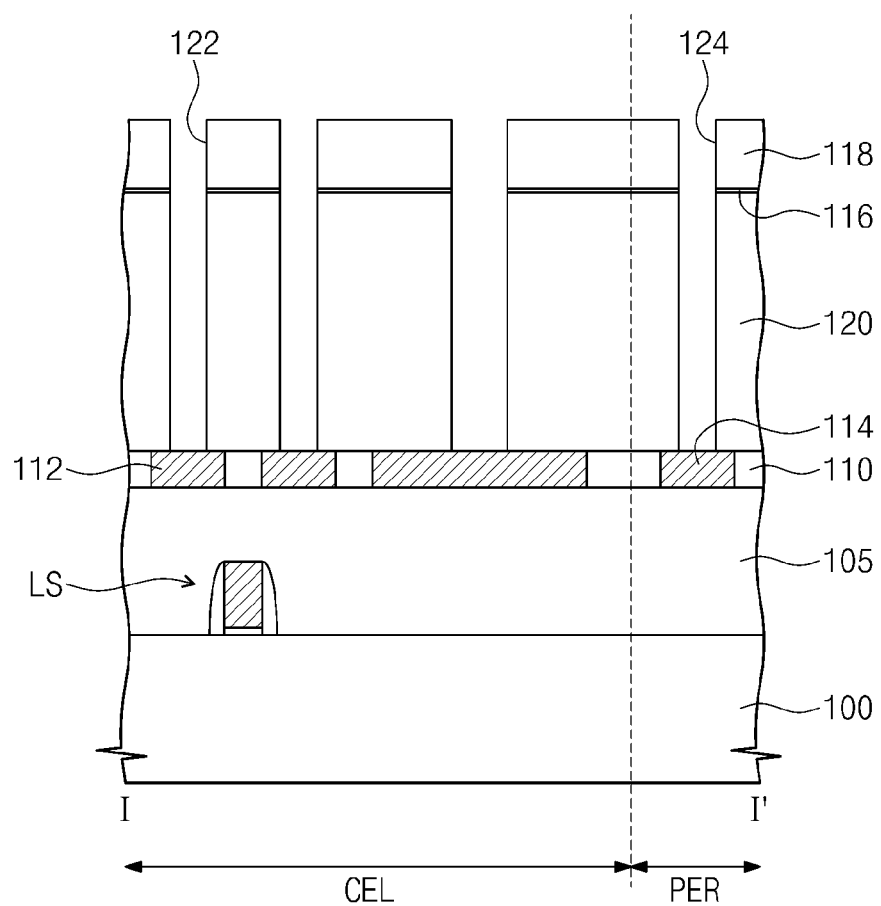
FIGS. 7A through 7F are sectional views illustrating a method of fabricating a semiconductor device, according to other example embodiments of the inventive concept.

Referring to FIG. 7A, the lower structure LS, the first insulating layer 105, the first line 112, the first defect detection line 114, and the second insulating layer 110 may be formed on the substrate 100 including the cell region CEL and the peripheral region PER. Process of forming the lower structure LS, the first insulating layer 105, the first line 112, the first defect detection line 114, and the second insulating layer 110 may be performed in the same manner as that described with reference to FIGS. 6A through 6C, and thus, the description thereof is omitted.

Thereafter, the third insulating layer 120, a first etch stop layer 116, and a first mask pattern 118 may be formed on the second insulating layer 110. The first etch stop layer 116 may be formed of or include a material different from the third insulating layer 120, and this makes it possible to protect the third insulating layer 120 in an etching step, which will be described with reference to FIG. 7C. For example, in the case where the first etch stop layer 116 includes a nitride layer, the third insulating layer 120 may be formed of or include an oxide layer.

The first etch stop layer 116 and the third insulating layer 120 may be etched using the first mask pattern 118 as an etch mask to form the first contact holes 122 and the second contact hole 124. The first contact holes 122 may be formed on the cell region CEL, and the second contact hole 124 may be formed on the peripheral region PER. The first mask pattern 118 may be removed after the etching process.

Figure 7B:
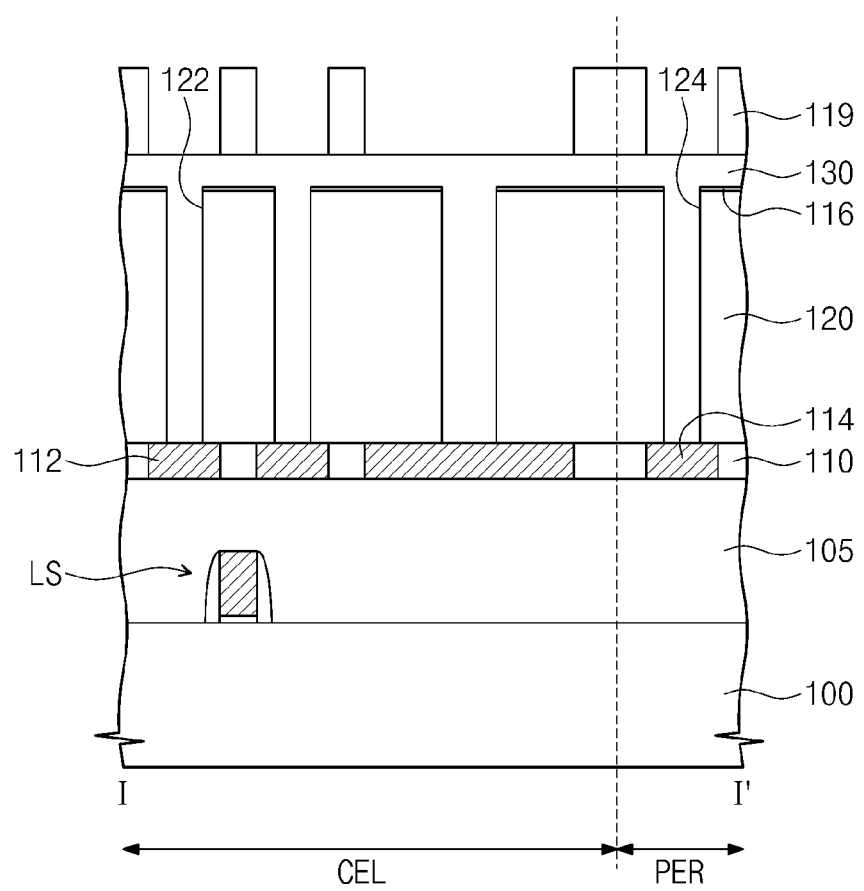

Referring to FIG. 7B, a fourth insulating layer 130 may be formed on the third insulating layer 120 to fill the first contact holes 122 and second contact hole 124, and a second mask pattern 119 may be formed on the fourth insulating layer 130.

Figure 7C:
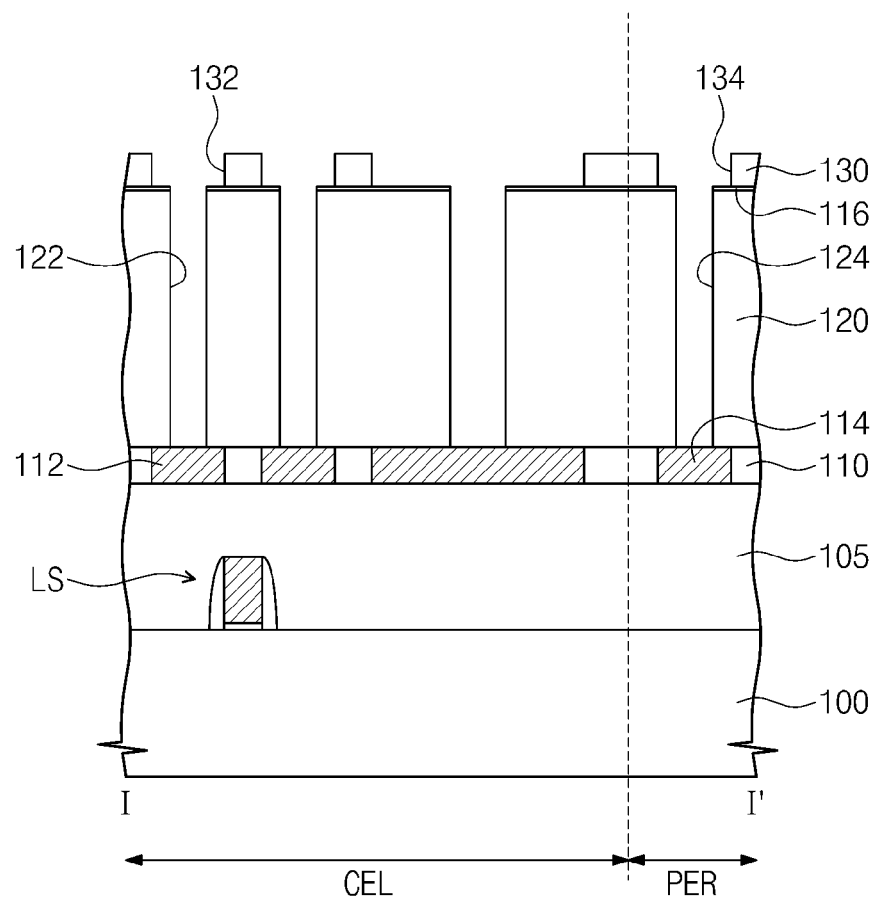

Referring to FIG. 7C, the fourth insulating layer 130 may be etched using the second mask pattern 119 as an etch mask to form the first openings 132 coupled to the first contact holes 122 and the second opening 134 coupled to the second contact hole 124. The first etch stop layer 116 may be used to prevent the third insulating layer 120 from being etched during the etching process. The second mask pattern 119 may be removed after the etching process.

Figure 7D:
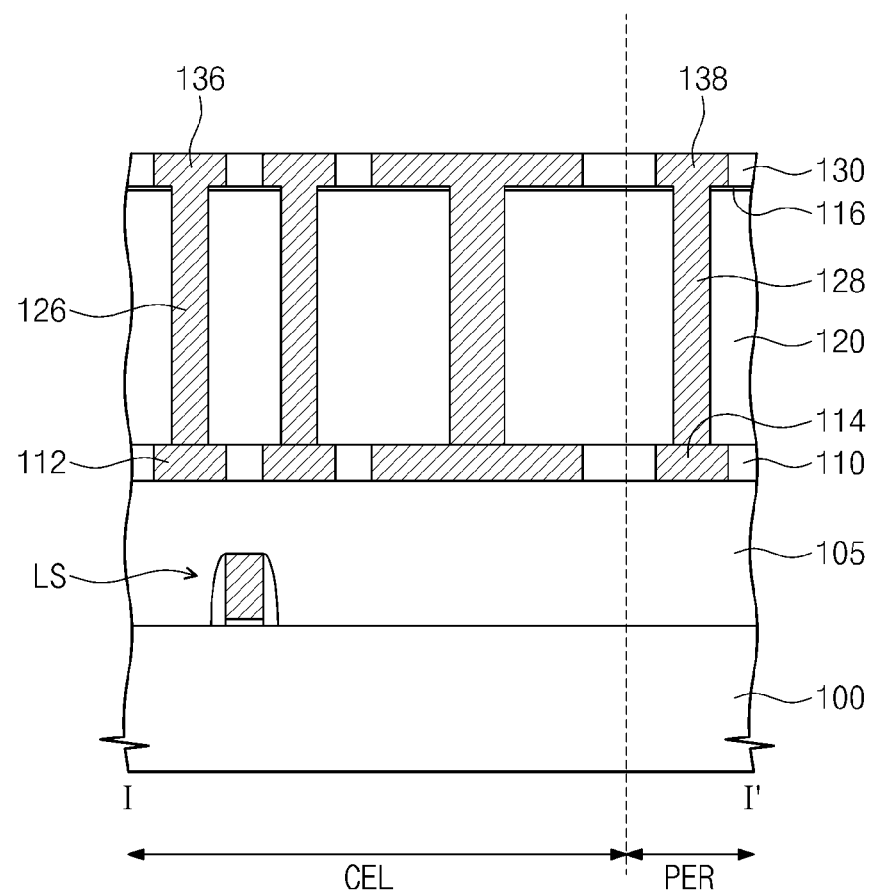

Referring to FIG. 7D, the first contact plugs 126, the second lines 136, the second contact plug 128, and the second defect detection line 138 may be formed by filling the first contact holes 122, the first openings 132, the second contact hole 124, and the second opening 134 with a conductive layer. At least one of the first contact plugs 126 on the cell region CEL may be continuously connected to at least one of the second lines 136, thereby forming a single body structure. The second contact plug 128 on the peripheral region PER may be continuously connected to the second defect detection line 138, thereby forming a single body structure.

Figure 7E:
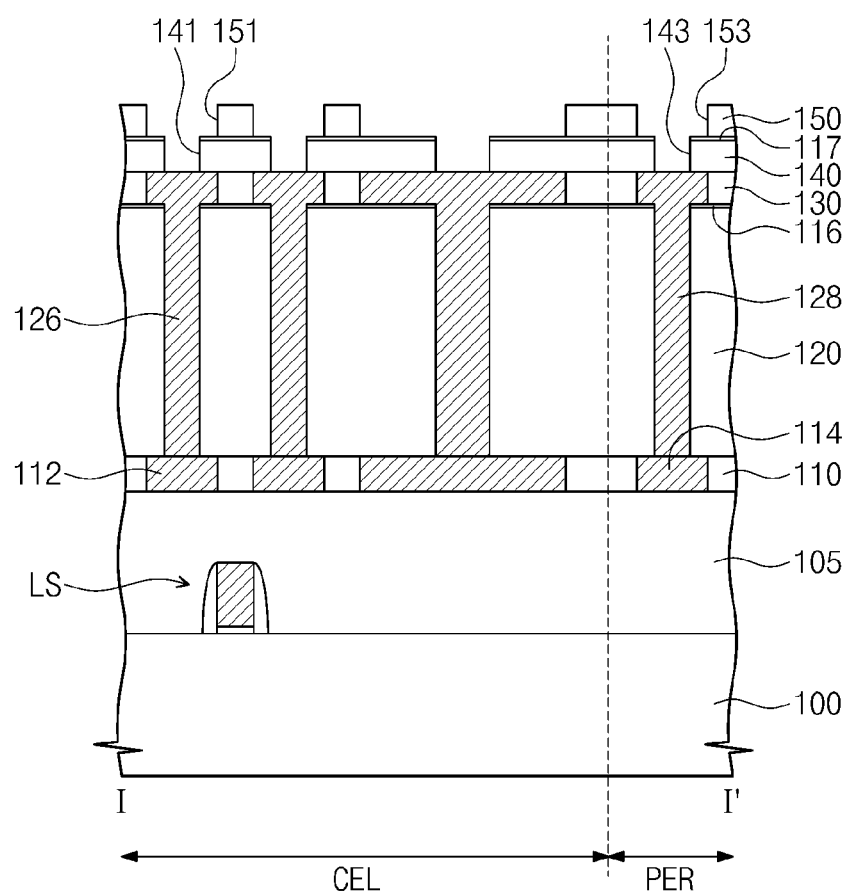

Referring to FIG. 7E, the fifth insulating layer 140 may be formed on the fourth insulating layer 130 to have third contact holes 141 and fourth contact hole 143, and the sixth insulating layer 150 may be formed on the fifth insulating layer 140 to have third openings 151 coupled to the third contact holes 141 and a fourth opening 153 coupled to the fourth contact hole 143. In certain embodiments, a second etch stop layer 117 may be further formed between the fifth insulating layer 140 and the sixth insulating layer 150.

The process described with reference to FIGS. 7A and 7B may be used to form the fifth insulating layer 140 having the third and fourth contact holes 141 and 143 and the sixth insulating layer 150 having the third and fourth openings 151 and 153, and thus, the description thereof is omitted.

Figure 7F:
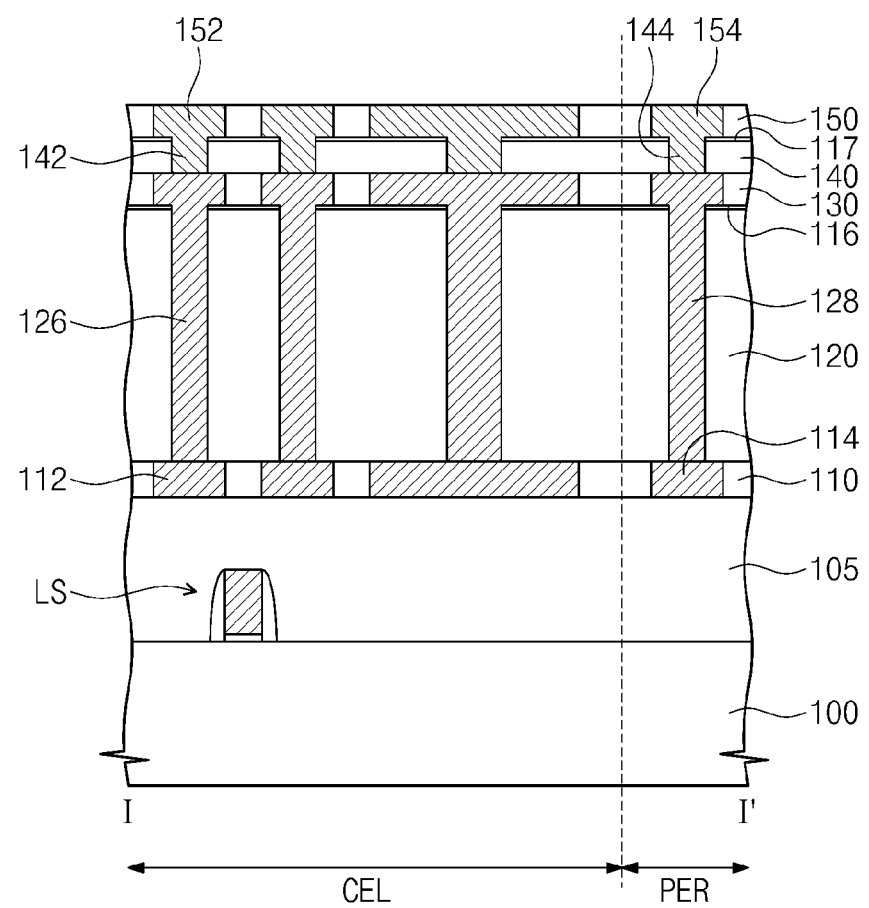

Referring to FIG. 7F, the third contact plugs 142, the third lines 152, the fourth contact plug 144, and the third defect detection line 154 may be formed by filling the third contact holes 141, the third openings 151, the fourth contact hole 143, and the fourth opening 153 with a conductive layer. At least one of the third contact plugs 142 on the cell region CEL may be continuously connected to at least one of the third lines 152, thereby forming a single body structure. The fourth contact plug 144 on the peripheral region PER may be continuously connected to the third defect detection line 154, thereby forming a single body structure.

Figure 8A:
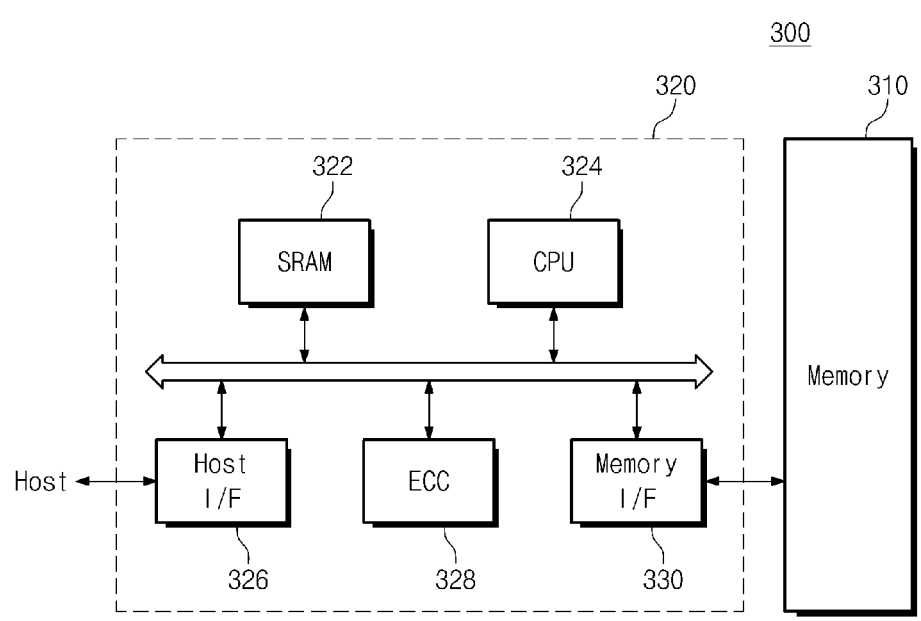
FIG. 8A is a block diagram illustrating a memory card including a semiconductor device according to example embodiments of the inventive concept.

FIG. 8A is a block diagram illustrating a memory card including a semiconductor device according to example embodiments of the inventive concept.

Referring to FIG. 8A, a semiconductor device according to example embodiments of the inventive concept may be applied to form a memory card 300. The memory card 300 may include a memory controller 320 to control a data exchange between a host and a memory device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the memory device 310. A memory interface 330 can interface with the memory device 310. The central processing unit 324 can control data exchange of the memory controller 320 with, for example, the memory device 310.

Figure 8B:
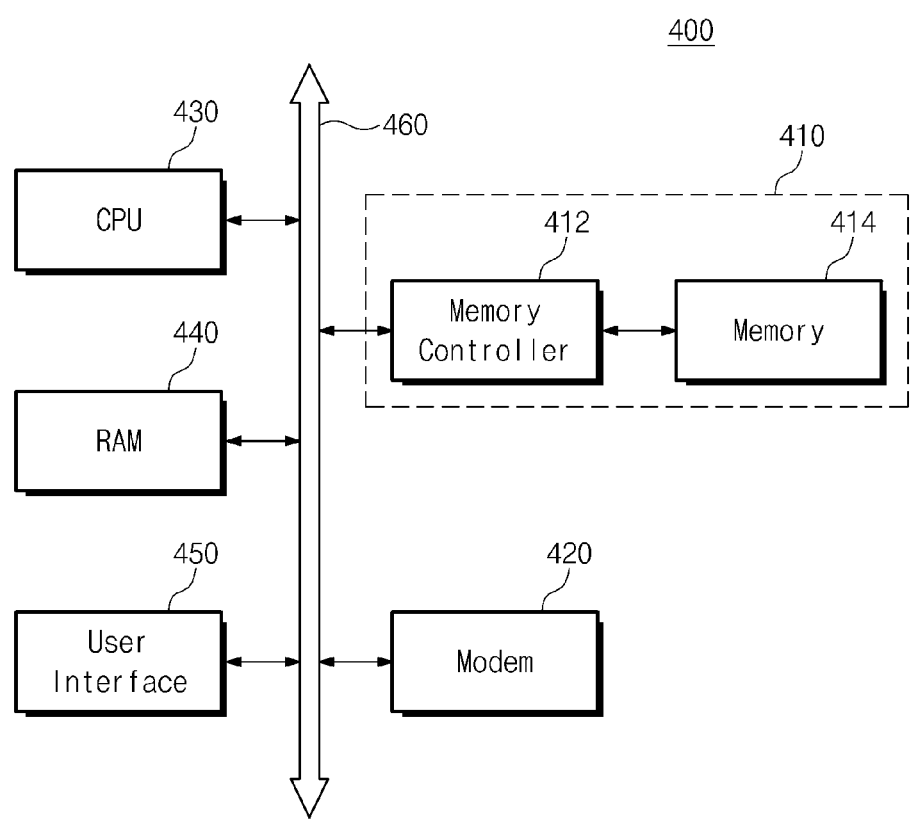
FIG. 8B is a block diagram illustrating an information processing system including a semiconductor device according to example embodiments of the inventive concept.

FIG. 8B is a block diagram illustrating an information processing system including a semiconductor device according to example embodiments of the inventive concept.

Referring to FIG. 8B, an information processing system 400 may include a semiconductor device according to example embodiments of the inventive concept. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414, and the memory system 410 may be the same as the memory card 300 described with reference to FIG. 8A. The information processing system 400 may be provided as a memory card, a solid state disk, a camera image sensor and an application chip set. For example, the memory system 410 may be a solid state disk (SSD), and in this case, the information processing system 400 may stably and reliably store data in the memory system 410.

According to example embodiments of the inventive concept, a defect detection structure may be configured to have a multi-layered structure (e.g., including a plurality of defect detection lines stacked at different levels). Accordingly, it is possible to examine a defect, which may occur at not only the top level but also the underlying level of the interconnection structure. In addition, a plurality of contact plugs may be provided to connect defect detection lines disposed at two different levels, and thus, an edge region of each chip can have a robust structure.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including a cell region and a peripheral region;
an interconnection structure on the cell region to include a first line and a second line sequentially stacked on the substrate; and
a defect detection structure on the peripheral region to include a first defect detection line and a second defect detection line provided at the same levels as those of the first and second lines, respectively,
wherein the defect detection structure substantially encloses the interconnection structure in plan view.

2. The device of claim 1, wherein the interconnection structure further comprises a first contact plug on the cell region to electrically connect the first and second lines to each other.

3. The device of claim 2, wherein the defect detection structure further comprises a second contact plug provided at the same level as that of the first contact plug, on the peripheral region, to electrically connect the first and second defect detection lines to each other.

4. The device of claim 1, wherein the interconnection structure further comprises a third line on the cell region and between the first and second lines.

5. The device of claim 4, wherein the interconnection structure further comprises a first contact plug electrically connecting the first and third lines to each other and a second contact plug electrically connecting the second and third lines to each other, and
the defect detection structure further comprises a third contact plug electrically connecting the first and second defect detection lines to each other.

6. The device of claim 4, wherein the defect detection structure further comprises a third defect detection line provided on the peripheral region and positioned at substantially the same level as that of the third line.

7. The device of claim 6, wherein the interconnection structure further comprises a first contact plug electrically connecting the first and third lines to each other and a second contact plug electrically connecting the second and third lines to each other, and
the defect detection structure further comprises a third contact plug electrically connecting the first and third defect detection lines to each other and a fourth contact plug electrically connecting the second and third defect detection lines to each other.

8. The device of claim 1, wherein, when viewed in plan view, the second defect detection line is shaped like an open rectangular ring having end portions separated from each other, and the defect detection structure further comprises detection pads electrically connected to the end portions of the second defect detection line.

9. The device of claim 8, wherein the first defect detection line has a shape corresponding to that of the second defect detection line.

10. The device of claim 8, wherein the first defect detection line comprises first patterns horizontally separated from each other.

11. The device of claim 10, wherein the defect detection structure further comprises a third defect detection line between the first and second defect detection lines, and the third defect detection line comprises second patterns which are horizontally separated from each other and are disposed to cross the first patterns.

12. The device of claim 11, wherein the defect detection structure further comprises two first contact plugs, which are connected in common to a corresponding one of the first patterns but are respectively connected to different ones of the second patterns.

13. The device of claim 11, wherein the defect detection structure further comprises a plurality of second contact plugs, each electrically connecting a corresponding one of the second patterns to the second defect detection line.

14. The device of claim 1, wherein, when viewed in plan view, the second defect detection line comprises patterns horizontally separated from each other to enclose the interconnection structure, and the defect detection structure further comprises detection pads electrically connected to end portions of each of the patterns.

15. The device of claim 1, wherein the first and second lines, the first and second defect detection lines, and the first and second contact plugs comprises at least one of polysilicon, tungsten, and copper.

* * * * *